(12) United States Patent
Garandet et al.

(10) Patent No.: US 8,974,216 B2
(45) Date of Patent: Mar. 10, 2015

(54) DEVICE AND METHOD FOR MECHANICALLY TEXTURING A SILICON WAFER INTENDED TO COMPRISE A PHOTOVOLTAIC CELL, AND RESULTING SILICON WAFER

(75) Inventors: Jean-Paul Garandet, Le Bourget du Lac (FR); Jacky Bancillon, Saint-Egreve (FR); Luc Federzoni, Bourgoin-Jallieu (FR); Marc Pirot, Saint Blaise du Buis (FR)

(73) Assignee: Commissariat a l' énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 13/643,746

(22) PCT Filed: Apr. 27, 2011

(86) PCT No.: PCT/EP2011/056660
§ 371 (c)(1),
(2), (4) Date: Oct. 26, 2012

(87) PCT Pub. No.: WO2011/134999
PCT Pub. Date: Nov. 3, 2011

(65) Prior Publication Data
US 2013/0040105 A1 Feb. 14, 2013

(30) Foreign Application Priority Data
Apr. 28, 2010 (FR) ...................................... 10 53268

(51) Int. Cl.
*B26D 3/06* (2006.01)
*B29C 59/02* (2006.01)
(Continued)

(52) U.S. Cl.
CPC .... *H01L 21/67092* (2013.01); *H01L 31/02363* (2013.01); *Y02E 10/50* (2013.01); *Y10S 977/902* (2013.01)
USPC ........ 425/385; 425/174.4; 264/219; 264/293; 977/902

(58) Field of Classification Search
CPC ...... G03F 7/0002; B82Y 40/00; B29C 59/02; B29C 59/00
USPC ................................ 264/293; 425/385, 174.4
See application file for complete search history.

(56) References Cited

U.S. PATENT DOCUMENTS 2,034,040 A * 3/1936 Johnson .......................... 493/36
2,561,231 A * 7/1951 Rose ............................... 83/885
(Continued)

FOREIGN PATENT DOCUMENTS

EP      0 969 519      1/2000
FR      2 620 269      3/1989

OTHER PUBLICATIONS

Fath, P. et al., "Progress in a novel high-throughput mechanical texturization technology for highly efficient multicrystalline silicon solar cells," Solar Energy Materials and Solar Cells, vol. 48, pp. 229 to 236, (Nov. 1997), XP-4111853A.
(Continued)

*Primary Examiner* — Joseph S Del Sole
*Assistant Examiner* — Nahida Sultana
(74) *Attorney, Agent, or Firm* — Oblon, Spivak, McClelland, Maier & Neustadt, L.L.P.

(57) ABSTRACT

A solution for texturing silicon wafers configured to constitute photovoltaic (PV) cells. Silicon wafers can be produced, the surface of which include uniformly engraved patterns having a depth of between 5 and 50 μm.

8 Claims, 3 Drawing Sheets

Figure 1:
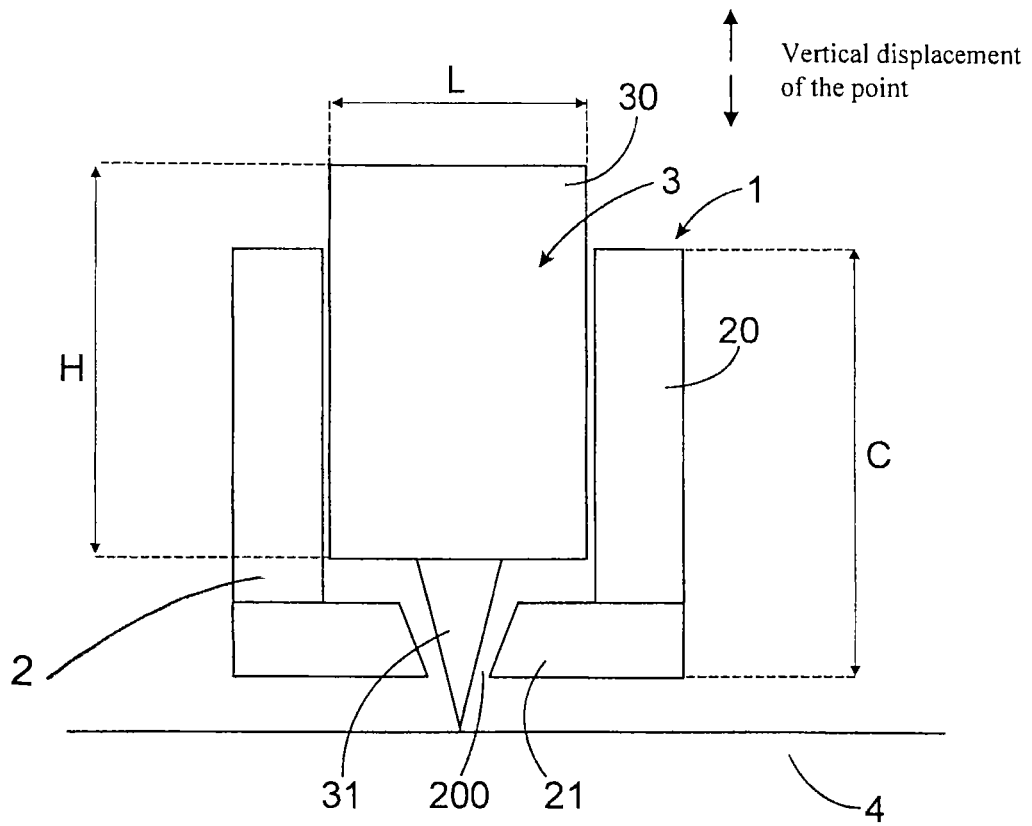

(51) Int. Cl.
*H01L 21/67* (2006.01)
*H01L 31/0236* (2006.01)

(56) References Cited

U.S. PATENT DOCUMENTS

| | | | |
|---|---|---|---|
| 4,194,094 A | 3/1980 | Redlich | |
| 4,821,250 A | 4/1989 | Redlich et al. | |
| 5,238,879 A | 8/1993 | Plaettner | |
| 5,378,289 A | 1/1995 | Noguchi et al. | |
| 5,704,992 A | 1/1998 | Willeke et al. | |
| 6,084,175 A | 7/2000 | Perry et al. | |
| 6,127,623 A | 10/2000 | Nakamura et al. | |
| 6,334,856 B1* | 1/2002 | Allen et al. | 604/191 |
| 6,365,059 B1* | 4/2002 | Pechenik | 216/52 |
| 6,908,453 B2* | 6/2005 | Fleming et al. | 604/173 |
| 7,931,844 B2* | 4/2011 | Lof | 264/293 |
| 2003/0080472 A1* | 5/2003 | Chou | 264/338 |
| 2005/0018587 A1* | 1/2005 | Petrin | 369/127 |
| 2005/0220923 A1* | 10/2005 | Yanagisawa et al. | 425/385 |
| 2009/0061039 A1* | 3/2009 | Zhang et al. | 425/436 R |
| 2010/0034911 A1* | 2/2010 | Mori et al. | 425/89 |
| 2011/0049760 A1* | 3/2011 | Lee | 264/293 |
| 2011/0220193 A1 | 9/2011 | Garandet et al. | |
| 2013/0001808 A1 | 1/2013 | Cros et al. | |
| 2013/0307173 A1 | 11/2013 | Bredeau et al. | |

OTHER PUBLICATIONS

Santinacci, L. et al., "AFM scratching and metal deposition through insulating layers on silicon," Surface Science, vol. 597, pp. 11 to 19, (Dec. 2005), XP-25381564A.

International Search Report Issued Jun. 14, 2011 in PCT/EP11/56660 Filed Apr. 27, 2011.

L Santinacci, et al., "Selective electrochemical gold deposition onto p-Si (100) surfaces" J. Phys. D: Appl. Phys., vol. 41, No. 175301, 2008, 10 Pages.

D. Kray, et al., "Solar Wafer Slicing with Loose and Fixed Grains" IEEE 4$^{th}$ World Conference on Photovoltaic Energy Conversion, vol. 1, May 7-12, 2006, pp. 948-951.

John Ransford Davis, Jr., et al., "Impurities in Silicon Solar Cells" IEEE Transactions on Electron Devices, vol. 27, No. 4, Apr. 1980, pp. 677-687.

U.S. Appl. No. 13/879,361, filed Apr. 12, 2013, Lebrun.

* cited by examiner ns of dimensions on wafers which are ready to be textured are, except in exceptional cases, significantly greater than 10 µm.

This being so, none of techniques proposed in the literature enables a mechanical texturing of a silicon wafer with etching patterns of a depth of the order of some ten µm.

The aim of the invention is therefore to propose a solution to accomplish a texturing of a silicon wafer with uniform etching patterns of characteristic size of between 5 and 50 µm over an area likely to have flatness defects of between 5 and 50 µm at speeds compatible with the production imperatives of PV cell factories, typically of a texturing duration of a few seconds per silicon wafer.

A more general aim is to propose a solution which is simple and efficient to implement.

DEVICE AND METHOD FOR MECHANICALLY TEXTURING A SILICON WAFER INTENDED TO COMPRISE A PHOTOVOLTAIC CELL, AND RESULTING SILICON WAFER

TECHNICAL FIELD

The invention concerns a device and a method for texturing a silicon wafer intended to constitute a photovoltaic cell.

It also concerns a silicon wafer obtained, and in particular a multicrystalline wafer.

PRIOR ART

Most photovoltaic cells (PV) are manufactured from monocrystalline or multicrystalline silicon in industrial sectors which implement the processing of silicon wafers in a clean room environment. The first step is a texturing of the surface of the wafer intended to reduce its reflectivity.

In the standard method used industrially, the crystallised ingots are cut by wire sawing into wafers which are textured by chemical attack to improve light trapping. To optimise the method, structures having the size of a few microns are generally sought. This chemical attack can be accomplished either in an acidic medium or in a basic medium.

In both abovementioned cases, the technique effectively enables the reflectivity to be reduced, but its disadvantage is that it requires the retreatment of substantial quantities of chemical effluents.

An alternative approach, based on a method of mechanical etching (a structuring tool consisting of a micro-machined metal part with V-shaped lines, and coated with an abrasive layer consisting of diamond abrasive coating) has been proposed by the University of Constance [1]. The method has demonstrated its effectiveness and its ability not to cause defects which might affect the PV cells' energy conversion rates. Furthermore, the problems of productivity (duration of process of several seconds per wafer) and of the wear and tear of the structuring tools have been resolved. However, problems of machining (notably concerning the radius of curvature of the points) and of granulometry of the diamond powders limit the method's effectiveness. In practice, the spatial resolution of the etching remains limited in standard implementations to values of the order of 50 µm.

At the other extreme in terms of scale, it is possible to cite the work accomplished by etching with an AFM point [2]. It is then possible to obtain extremely fine patterns, the surfaces of which are very clean at the submicron scale. However, the speeds of movement of the point are very slow (at best some hundred microns per second) and therefore incompatible with an industrial method.

There is therefore no simple and effective method allowing high-speed etching of silicon wafers to form textures of characteristic size of the order of some ten microns. The problem is even more complex due to the fact that cutting the ingots using a wire saw causes variations of thickness, which in the conventional method of abrasion by particles of silicon carbide are of the order of 30-40 µm [3]. Even with more sophisticated and more expensive methods using diamond particles, it appears to be difficult to go below a depth of 10 µm [3].

In addition, a chemical pretreatment is generally applied, enabling the cold-hammered zone to be eliminated following the cutting. Due to kinetics of attacks which differ depend on the crystalline grains, the effect of this pretreatment is also to increase the roughness of the wafers. In conclusion, the varia-

DESCRIPTION OF THE INVENTION

To accomplish this, the object of the invention is a device for mechanical texturing of a silicon wafer, intended to constitute a photovoltaic cell, including multiple tungsten carbide points and a support including multiple recesses, each of which is able to hold a tungsten carbide point such that it can slide, and means to keep each of the multiple points pressed against the silicon wafer with a constant force which is independent of the thickness variations of the said wafer.

The support is preferably able to hold the points such that they can slide freely. The means to maintain pressing are then advantageously constituted by the inherent weight of each of the points.

In other words, according to the invention, a texturing by mechanical etching is accomplished by using a system of self-regulation of the pressing force suitable for texturing silicon wafers which are not flat at the scale of some tens of microns.

To resolve the difficulty relating to the flatness defects, the invention uses a system in which the multiple etching points slide freely to follow the changes of level of the surface to be etched. The pressing force therefore remains equal to the weight of the point, whatever the geometric level of the surface to be etched. The vertical displacement of the points is guided by a support.

It may be considered that the principle of etching using a weighted mass is known [4], but the solution according to this document [4], U.S. Pat. No. 4,821,250A, is applied locally by a point to etch a furrow. However, the specific feature of the problem at the origin of the invention is the need to texture collectively, i.e. simultaneously over the entire surface to be etched, a silicon wafer to adhere to the specification of texturing duration.

Thus, the device according to the invention includes a structural part (support) with recesses where the points are inserted. These recesses are offset relative to one another by a distance d defining the etching interval. The recesses are separated from one another to ensure the mechanical cohesion of the assembly. The lower parts of the recesses are trapezoid, with an angle at the peak greater than that of the points, to allow them to slide vertically.

To obtain etching profiles of a depth of the order of 5-20 µm, which is typical of that which is conventionally used for PV applications, a pressing force of between 0.1 and 2 N, and preferentially 0.3 to 1 N, is preferred. And it was not in any way obvious that silicon wafers could withstand the stress, but the tests undertaken show that they are able to do so, up to pressing forces of 2 N, unless the wafers have substantial initial fractures.

Another difficulty relates to the geometrical encumbrance of the system. Indeed, the dimensions of the points (similar to parallelepipedes of base L×l and of height H) and those of the etching zone A and B are related by the following equations:

$$k \times (L+e1) = A \text{ and } n \times (1+e2) = B.$$

The device is also specified by the constraint of the etching interval d according to:

$$n \times d = L + e1.$$

Figure 2:
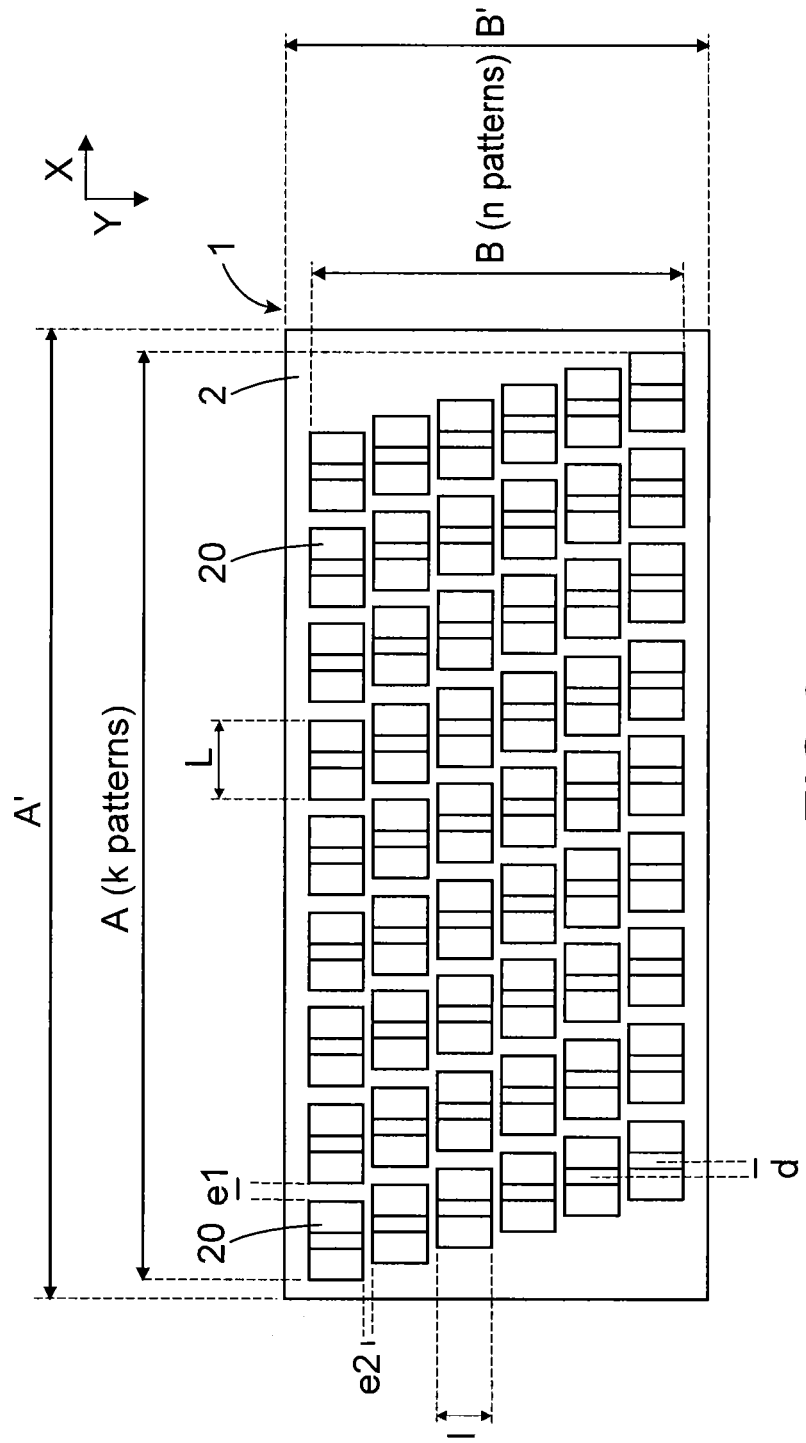
Figure 3:
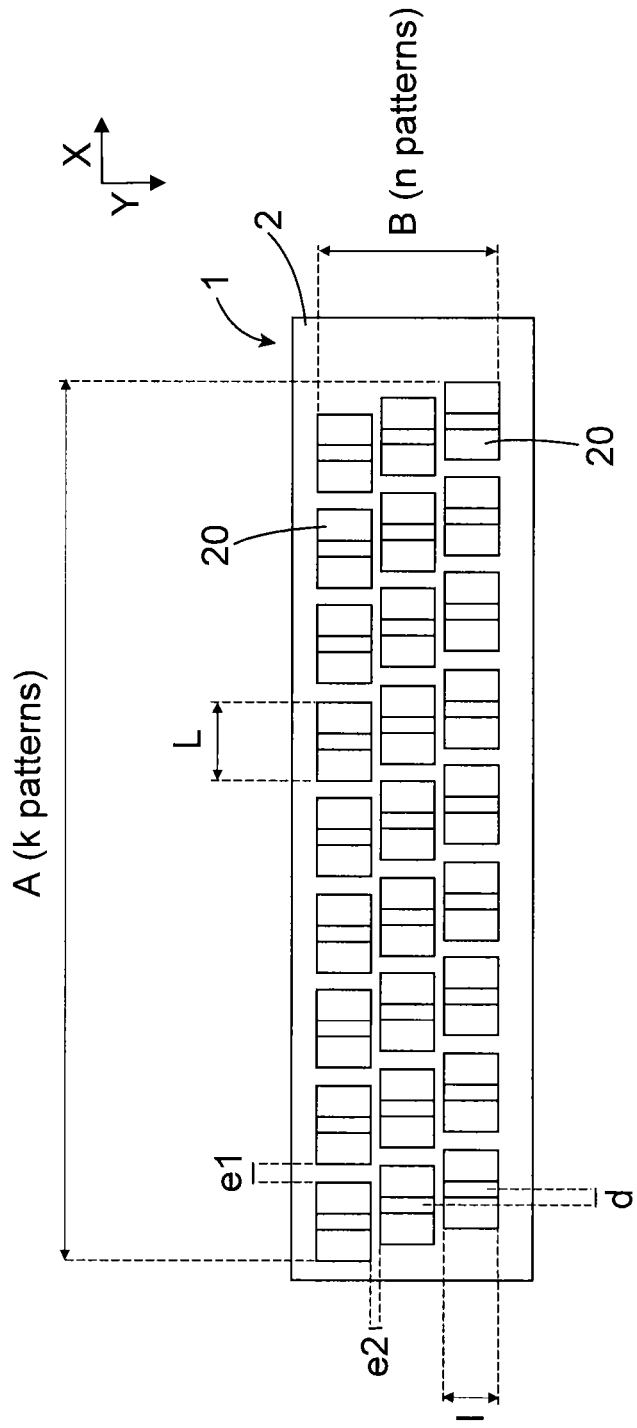

The references of the letters used to define the dimensions and the integers are shown in FIGS. 2 and 3.

Length A is determined by the dimensions of the wafers to be textured, typically A=15 cm. To clarify matters, by taking reasonable values for the dimensions of the recesses and spacings, L=4 mm, 1=2 mm, e1=e2=1 mm and an etching interval d of 20 μm, the above relationships give:

$$k=30, n=250, B=0.75 \text{ m}.$$

If such a value for B may appear high, it is perfectly acceptable for an industrial application, especially if it is possible to texture several wafers aligned in direction Y. There are also two possibilities for reducing dimension B: texturing in several stages, with offsetting of the tool in direction X, perpendicular to the etching direction Y (see the references of the directions in FIGS. 2 and 3).

This amounts to a redefinition of the above condition of equality:

$$n \times d = (L+e1),$$

as n×d=(L+e1)/j, where j is an integer.

For a given value of L, it is therefore possible to reduce n and therefore B by a factor j. However, for reasons of productivity, this solution is not realistic for values of j higher than 3.

Another option to reduce B would be to reduce dimension l, but the problem of attaining a reasonable mass without requiring an unacceptable height H is then posed.

Indeed, with a material such as silicon carbide of density ρ of the order of 3.2 kg/m³, reaching a force of 0.5 N with a parallelepipede of base 4×2 mm² would require a height of nearly 2 m, which poses obvious problems of volume of the device and of fragility of the points. This is a fundamental problem, and even maintaining B at a maximum value of 0.75 m and texturing with j=5 stages would not enable these problems to be resolved. Indeed, by keeping values L=4 mm, e1=1 mm and an etching interval d of 20 μm, this results in k=30 and n=50. By keeping B=0.75 m and e2=1 mm, it would be possible to take l=1.4 cm, which should be compared with 2 mm of the previous case.

Even under these extreme conditions which are not realistic for industrial configurations, there would be a value of H greater than 28 cm, which once again would be a limit due to questions of encumbrance of the device, and of fragility of the points. The use of diamond (ρ=3.5 kg/m³) poses a problem in terms of cost, and allows only a limited improvement (reduction of H of only 100).

The hard materials renowned for being compatible with silicon (diamond and silicon carbide) are not therefore suitable for implementing the invention.

To respond to this difficulty the inventors decided to test tungsten carbide as an etching material, the density of which, which is greater than 15 kg/m³, allows genuine technological breakdown compared to diamond or silicon carbide. And it was not in any way obvious to use this material as a material for etching silicon wafers for PV applications, since tungsten is amongst the metals which are most harmful for the lifetime of minority carriers, and therefore for the efficiency of PV cells [5]. As an example, a content of the order of one part per billion (ppb, or in equivalent fashion 5*1013 at/cm³) is enough to reduce by more than 40% the efficiency of a PV cell in p-type silicon. However, the tests undertaken enabled it to be shown that the electronic properties of the wafers were not affected, thus validating the choice of tungsten carbide.

In the implementation of the invention, the lower portion of the points has the shape of a straight prism of triangular base, where the angle at the apex of the triangle is chosen such that it is in the interval 20°-60°, and advantageously 30°-45°. The upper portion of the points is preferentially a parallelepipede, but other shapes can be envisaged. For a parallelepipedic shape, the characteristic dimensions are:

length L of 2 to 15 mm,
width l of 1 to 5 mm,
height H of 1 to 25 cm.

Etching interval d defined as being the distance separating two adjacent points is preferably chosen to be between 5 μm and 100 μm, and preferentially between 5 μm and 40 μm.

The speed of displacement is between 5 and 100 mm/s, and preferentially 10 to 30 mm/s.

The structural part is preferably manufactured from materials of the steel or nickel-based superalloy. It should be noted that whatever the chosen configuration the number of etching points per wafer will be very high, typically always several thousands. It is therefore advantageously possible to automate the insertion of the points in their respective recesses.

In a variant of the invention a gaseous pressure is applied to the points to increase the pressing force. As an example, a pressure of 1 bar acting on an area of 10 mm² equates to a force of 1 N. This operating mode enables the principle to be retained of a pressing force which is independent of the geometrical level of the wafer to be etched, but the need is once again found to have points of sufficient area L×l.

Some advantages of the invention are as follows:
possibility of achieving texturing profiles other than pyramids in order to allow optimisation of the light trapping: these various profiles will be able to be attained by choosing different geometrical shapes of the points,
possibility of adjusting the pressing force by altering the geometrical characteristics of the points,
the points, which are wearing parts, can be manufactured using low-cost technologies of the powder metallurgy type,
combined with an image processing allowing identification of defective etches from the surface of the wafer, the method allows selective replacement only of the worn points,
very much shorter texturing time and possibility of simultaneously texturing several wafers positioned adjoining one another in direction Y.

The aim of the invention is therefore in particular a multicrystalline silicon wafer, intended to constitute a photovoltaic cell, the surface of which includes uniform etching patterns of a depth of between 5 and 50 μm.

BRIEF DESCRIPTION OF THE ILLUSTRATIONS

Other advantages and characteristics will be seen more clearly on reading the description given for illustrative purposes, made with reference to the following figures, among which:

FIG. 1 is a schematic transverse section view of a device according to the invention, FIG. 2 is a top view of a device according to the invention, according to one embodiment, FIG. 3 is a top view of a device according to the invention, according to another embodiment.

DETAILED ACCOUNT OF PARTICULAR EMBODIMENTS

As shown in FIG. 1, a device according to the invention 1 includes a support 2 in which multiple identical points 3 are held such that they are able to slide freely.

The upper portions of recesses 20 are parallelepipedic in shape, and have an angle at the apex 200 which is trapezoid in shape in their lower portion 21.

Upper portion 30 of the points is parallelepipedic in shape, and lower portion 31 is a straight prism of triangular shape.

In the etching position triangular portion 31 of points 3 is pressing against a silicon wafer 4 with a constant force independent of the thickness variations of wafer 4.

The points are made of tungsten carbide, preferably using a fritting technology.

The angle at the apex of the lower triangular points portion 31 is 30° less than that 200 of lower portion 21 of support 2.

The dimensions of the upper parallelepipedic portion 30 of points 3 are typically:

L=5 mm, l=2 mm and H=20 cm.

Recesses 20 for the points are separated by e1=e2=1 mm. With a typical density of tungsten carbide ρ of the order of 15 kg/m$^3$, a mass of 30 g per point 3 is found, and therefore a pressing force by the inherent weight of each point of the order of 0.3 N.

The texturing is advantageously accomplished in three stages, with an interval d of 20 μm. It can also be accomplished in a single stage using a device according to FIG. 2, or two stages, with a device according to FIG. 3.

In the case of texturing in three stages, structure part or support 2 is manufactured from stainless steel, with a functional zone, i.e. the zone corresponding to the zone to be etched, of dimensions A=15 cm and B=30 cm. The external dimensions of support 2 are A'=20 cm, B'=35 cm and C=15 cm. The differences between A and A' on the one hand and B and B' on the other hand are related to a mechanical reinforcement of support 2 around area A×B including recesses 20 of tungsten carbide etching points 3.

The device with its points 3 held in its support 2 is positioned on two silicon wafers of dimensions 15×15 cm$^2$ placed end-to-end.

Support 2 is then displaced at a speed of 20 mm/s above the two end-to-end wafers to accomplish the texturing. The etching residues are eliminated by blowing with compressed air. Light rinsing in an acidic solution can also be used.

REFERENCES CITED

[1]: P. Fath, C. Borst, C. Zechner, E. Bucher, G. Willeke, S. Narayanan, "*Progress in a novel high-throughput mechanical texturization technology for highly efficient multicrystalline silicon solar cells*", Solar Energy Materials and Solar Cells 48 (1997) 229-236;

[2]: L Santinacci, T Djenizian, P Schwauer, T Suter, A Etcheberry and P Schmuki, "*Selective electrochemical gold deposition onto p-Si(100) surfaces*", J. Phys. D: Appl. Phys. 41 (2008) 175301;

[3]: D. Kray, M. Schumann, A. Eyer, G. P. Willeke, R. Kübler, J. Beinert and G. Kleer, "*Solar wafer slicing with loose and fixed grains*", Proc. 2006 IEEE 4th World Conference on Photovoltaic Energy Conversion, May 7-12 2006, Hawai, Vol. 1, 948-951;

[4]: U.S. Pat. No. 4,821,250A entitled "*Process and apparatus for the recording of an information signal*";

[5]: J. R. Davis, Jr et al. "*Impurities in silicon solar cells*", IEEE Transactions on Electron Devices 27 (1980) 677-687.

The invention claimed is:

1. A device for mechanical texturing of a silicon wafer that is configured to constitute a photovoltaic cell, comprising:
    a support including multiple recesses, each of which is configured to hold a tungsten carbide point;
    multiple tungsten carbide points slidably mounted within the multiple recesses respectively such that each tungsten carbide point can slide vertically within a respective recess; and
    means to keep each of the multiple points pressed against the silicon wafer at the same time with a constant force that is independent of thickness variations of the wafer.

2. The device according to claim 1, in which the support is configured to hold the points such that the points can slide freely.

3. The device according to claim 2, in which the means includes an inherent weight of each of the points.

4. The device according to claim 3, in which the points have a lower portion in a form of a straight prism with a triangular base, an angle at an apex of which is less than that of the recesses configured to hold the points.

5. The device according to claim 4, in which the angle at the apex of the triangle of the points is between 30° and 45°.

6. The device according to claim 3, in which an etching interval is between 5 μm and 40 μm.

7. A device for mechanical texturing of a silicon wafer that is configured to constitute a photovoltaic cell, comprising:
    multiple tungsten carbide points and a support including multiple recesses, each of which is configured to hold a tungsten carbide point such that the tungsten carbide point can slide; and
    means to keep each of the multiple points pressed against the silicon wafer at the same time with a constant force that is independent of thickness variations of the wafer, wherein:
        the support is configured to hold the points such that the points can slide freely,
        the means includes an inherent weight of each of the points, and
        the points have a lower portion in a form of a straight prism with a triangular base, an angle at an apex of which is less than that of the recesses configured to hold the points.

8. The device according to claim 7, in which the angle at the apex of the triangle of the points is between 30° and 45°.

* * * * *